United States Patent
Thompson et al.

(10) Patent No.: US 9,952,252 B2
(45) Date of Patent: Apr. 24, 2018

(54) OFFSET REJECTION ELECTRODES

(71) Applicant: InvenSense, Inc., San Jose, CA (US)

(72) Inventors: Matthew Julian Thompson, Beaverton, OR (US); Kirt Reed Williams, Portola Valley, CA (US)

(73) Assignee: InvenSense, Inc., San Jose, CA (US)

( * ) Notice: Subject to any disclaimer, the term of this patent is extended or adjusted under 35 U.S.C. 154(b) by 287 days.

(21) Appl. No.: 14/714,149

(22) Filed: May 15, 2015

(65) Prior Publication Data

US 2016/0334438 A1    Nov. 17, 2016

(51) Int. Cl.
*G01P 15/125* (2006.01)
*B81B 7/00* (2006.01)
*G01P 15/08* (2006.01)

(52) U.S. Cl.
CPC .......... *G01P 15/125* (2013.01); *B81B 7/0016* (2013.01); *B81B 2203/0307* (2013.01); *G01P 2015/0831* (2013.01)

(58) Field of Classification Search
CPC ........... G01P 15/125; G01P 2015/0831; B81B 7/0016; B81B 2203/0307
See application file for complete search history.

(56) References Cited

U.S. PATENT DOCUMENTS

| | | | | |
|---|---|---|---|---|
| 4,372,162 A | * | 2/1983 | Shutt | G01P 15/125 318/651 |
| 4,398,417 A | * | 8/1983 | Shutt | G01P 15/125 73/497 |
| 4,398,418 A | * | 8/1983 | Shutt | G01P 15/125 318/651 |
| 4,644,793 A | * | 2/1987 | Church | G01C 19/5691 73/504.13 |
| 4,951,508 A | * | 8/1990 | Loper, Jr. | G01C 19/5691 73/1.84 |
| 5,383,362 A | * | 1/1995 | Putty | G01C 19/5677 73/504.01 |
| 5,406,848 A | * | 4/1995 | Okada | G01L 1/144 73/514.32 |
| 5,419,194 A | * | 5/1995 | Varnham | G01C 19/5691 73/504.13 |

(Continued)

FOREIGN PATENT DOCUMENTS

| GB | 2272054 A | * | 5/1994 | ......... G01C 19/5691 |
|---|---|---|---|---|
| GB | 2310284 A | * | 8/1997 | ......... G01C 19/5677 |

*Primary Examiner* — David Bolduc

(57) ABSTRACT

A system and method for reducing offset in a MEMS sensor are disclosed. In a first aspect, the system is a MEMS sensor that comprises a sensing reference plane, at least one anchor coupled to the sensing reference plane, at least one proof mass coupled to the at least one anchor, wherein one of the at least one proof mass moves under an external excitation, a pattern of sensing elements coupled between the sensing reference plane and the at least one proof mass to detect motion normal to the sensing reference plane, wherein the pattern of sensing elements shares at least three axes of polarity anti-symmetry, and a signal processing circuit to combine the pattern of sensing elements thereby providing an output proportional to the external excitation. In a second aspect, the sensing reference plane is divided by two axes forming four quadrants on the sensing reference plane.

10 Claims, 9 Drawing Sheets

(56) References Cited

U.S. PATENT DOCUMENTS

| | | | | |
|---|---|---|---|---|
| 5,495,760 | A * | 3/1996 | Wirt | G01C 19/5691 73/504.13 |
| 5,497,668 | A * | 3/1996 | Okada | G01L 5/165 73/514.32 |
| 5,712,426 | A * | 1/1998 | Sapuppo | G01C 19/42 73/504.02 |
| 6,196,067 | B1 * | 3/2001 | Martin | G01P 15/0802 73/514.32 |
| 6,314,823 | B1 * | 11/2001 | Okada | B81B 3/0021 73/862.043 |
| 7,549,334 | B2 * | 6/2009 | Cardarelli | G01C 19/5719 73/1.77 |
| 8,616,056 | B2 * | 12/2013 | Sammoura | G01C 19/5698 73/504.13 |
| 8,631,700 | B2 * | 1/2014 | Sammoura | G01C 19/5698 73/504.12 |
| 8,661,898 | B2 * | 3/2014 | Watson | G01C 19/5691 73/504.08 |
| 8,852,984 | B1 * | 10/2014 | Quevy | B81B 3/0062 438/48 |
| 9,599,471 | B2 * | 3/2017 | Vohra | G01C 19/5698 |
| 2004/0216523 | A1 * | 11/2004 | Lehtonen | G01P 15/125 73/514.32 |
| 2009/0095081 | A1 * | 4/2009 | Nakatani | G01P 15/125 73/514.32 |
| 2009/0100930 | A1 * | 4/2009 | Coronato | G01C 19/5712 73/504.12 |
| 2009/0107239 | A1 * | 4/2009 | Nakatani | B81B 3/0021 73/514.32 |
| 2012/0017681 | A1 * | 1/2012 | Reinmuth | G01P 15/125 73/514.35 |

* cited by examiner

OFFSET REJECTION ELECTRODES

FIELD OF THE INVENTION

The present invention relates to microelectromechanical system (MEMS) sensors, and more particularly, to MEMS sensors utilizing offset rejection electrodes.

BACKGROUND

Microelectromechanical system (MEMS) sensors experience a variety of undesirable forces that can come from the fabrication of the MEMS/complementary metal-oxide-semiconductor (CMOS) die, packaging of the die, operation over temperature, shock conditions, user assembly, and many others. These forces cause non-ideal conditions such as deviations in the parallel alignment between the MEMS sensor and an embedded sensing reference plane. Therefore, there is a strong need for a solution that overcomes the aforementioned issues. The present invention addresses such a need.

SUMMARY OF THE INVENTION

A system and method for reducing offset in a MEMS sensor are disclosed. In a first aspect, the system is a MEMS sensor that comprises a sensing reference plane, at least one anchor coupled to the sensing reference plane, at least one proof mass coupled to the at least one anchor, wherein one of the at least one proof mass moves under an external excitation, a pattern of sensing elements coupled between the sensing reference plane and the at least one proof mass to detect motion normal to the sensing reference plane, wherein the pattern of sensing elements shares at least three axes of polarity anti-symmetry, and a signal processing circuit to combine the pattern of sensing elements thereby providing an output proportional to the external excitation.

In a second aspect, the sensing reference plane is divided by two axes forming four quadrants on the sensing reference plane and the pattern of sensing elements comprises at least three sensing elements in each of the four quadrants.

In a third aspect, a method provides the MEMS sensors as described above in the first and the second aspects.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

The present invention relates to microelectromechanical system (MEMS) sensors, and more particularly, to MEMS sensors utilizing offset-rejection electrodes. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-electro-mechanical systems (MEMS) refers to a class of microscale devices fabricated using semiconductor-like processes and exhibiting mechanical characteristics such as the ability to move or deform. MEMS often, but not always, interact with electrical signals. A MEMS device may refer to a semiconductor device implemented as a micro-electromechanical system. A MEMS device includes mechanical elements and optionally includes electronics for sensing. MEMS devices include but are not limited to microscale gyroscopes, accelerometers, magnetometers, and pressure sensors.

In one embodiment, a MEMS sensor comprises a MEMS device, a sensing reference plane, and an anchor that connects the MEMS device to the sensing reference plane. MEMS sensors can experience undesirable forces during the fabrication and operation of the MEMS sensors. These undesirable forces include but are not limited to stresses from fabrication and packaging of the MEMS/CMOS die, operation over temperature, shock conditions, and user assembly which cause non-ideal conditions such as deviations in the parallel alignment between the MEMS device and the sensing reference plane.

There are at least two independent undesirable deviations of the parallel alignment between the MEMS device and the sensing reference plane that occur. Firstly, shear forces on the anchor cause the anchor to tilt relative to the sensing reference plane. Secondly, bending forces cause the sensing reference plane to curve relative to the MEMS device. Therefore, the gap $z(x,y)$ between sensing reference plane and the MEMS device varies with the x and y position and is described from the anchor center as a linear function and a non-linear curvature component per the following equation: $z(x,y) = gap + R(x,y) + Curv(NL(x,y))$; where the gap=ideal initial parallel gap, $R(x,y)$ is the rotation and $Curv(NL(x,y))$ is a mathematical description of the curvature that can be a polynomial, trigonometric series, power series or similar non-linear function or series.

Figure 1:
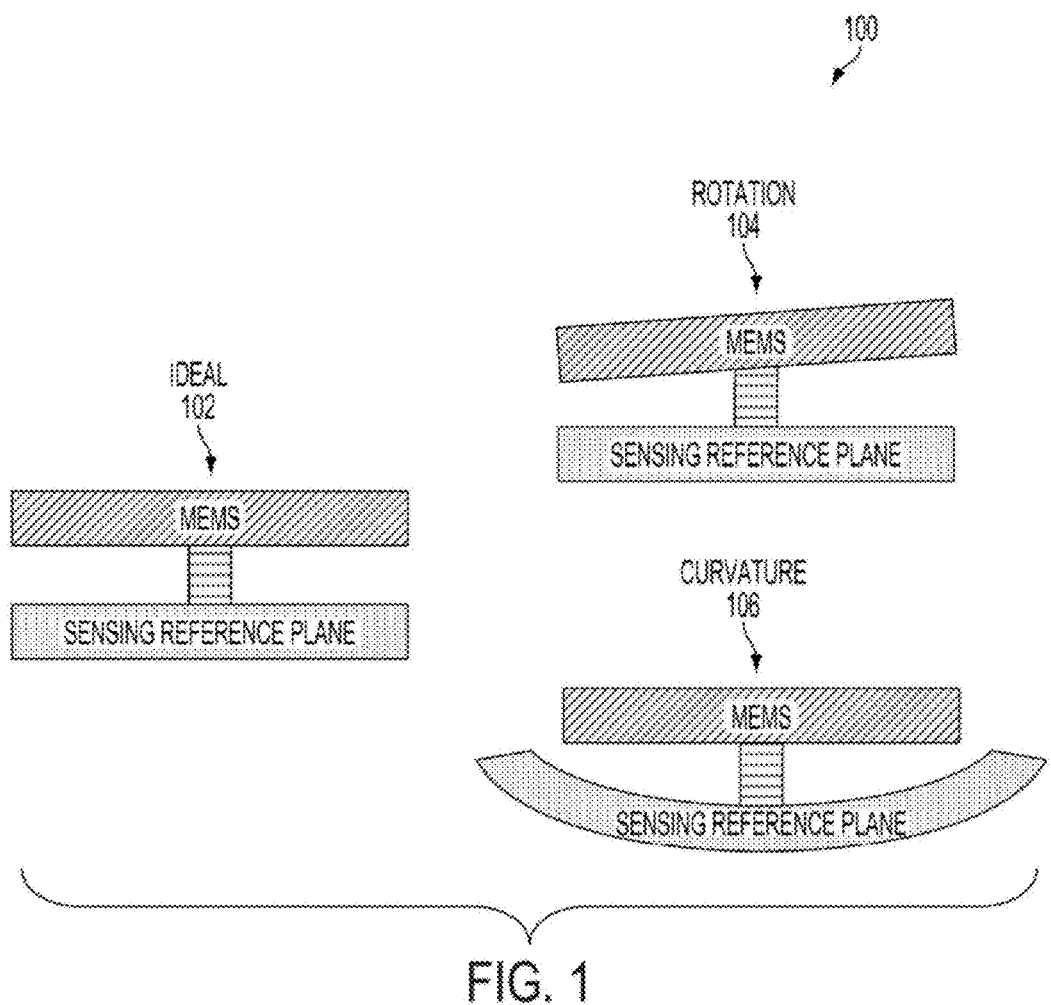
FIG. 1 illustrates a cross-sectional diagram of ideal and non-ideal MEMS sensor conditions in accordance with an embodiment.

FIG. 1 illustrates a cross-sectional diagram 100 of ideal and non-ideal MEMS sensor conditions in accordance with an embodiment. In one embodiment, the MEMS sensor includes at least a MEMS device, a sensing reference plane, and an anchor that couples the MEMS device to the sensing reference plane. In the diagram 100, an ideal condition 102 shows parallel alignment between the MEMS device and the sensing reference plane. In the diagram 100, a first non-ideal condition 104 shows a deviation in the parallel alignment due to an undesired linear tilt of at least one surface (either the MEMS device as depicted and/or the sensing reference plane). In the diagram 100, a second non-ideal condition 106 shows a deviation in the parallel alignment due to an undesired curvature of at least one surface (either the sensing reference plane as depicted and/or the MEMS device).

A system and method in accordance with the present invention provides a MEMS sensor with a sensing reference plane that comprises a pattern of sensing elements (electrodes) to improve offset rejection. The pattern of sensing elements can be a plurality of patterns of electrodes that reduce the offset caused from the deviation of the parallel alignment between the MEMS device and the sensing reference plane. The sensing reference plane is connected to a MEMS device via an anchor. The MEMS device includes a spring connected between the anchor and a proof mass. Each electrode of the plurality of patterns of electrodes is located on the sensing reference plane such as a CMOS substrate. In a MEMS device/CMOS substrate die configuration, the proof mass and one of the plurality of electrodes located on the CMOS substrate (or sensing reference plane) form a parallel plate capacitor.

To describe the features of the present invention in more detail, refer now to the following description in conjunction with the accompanying Figures.

Figure 2A:
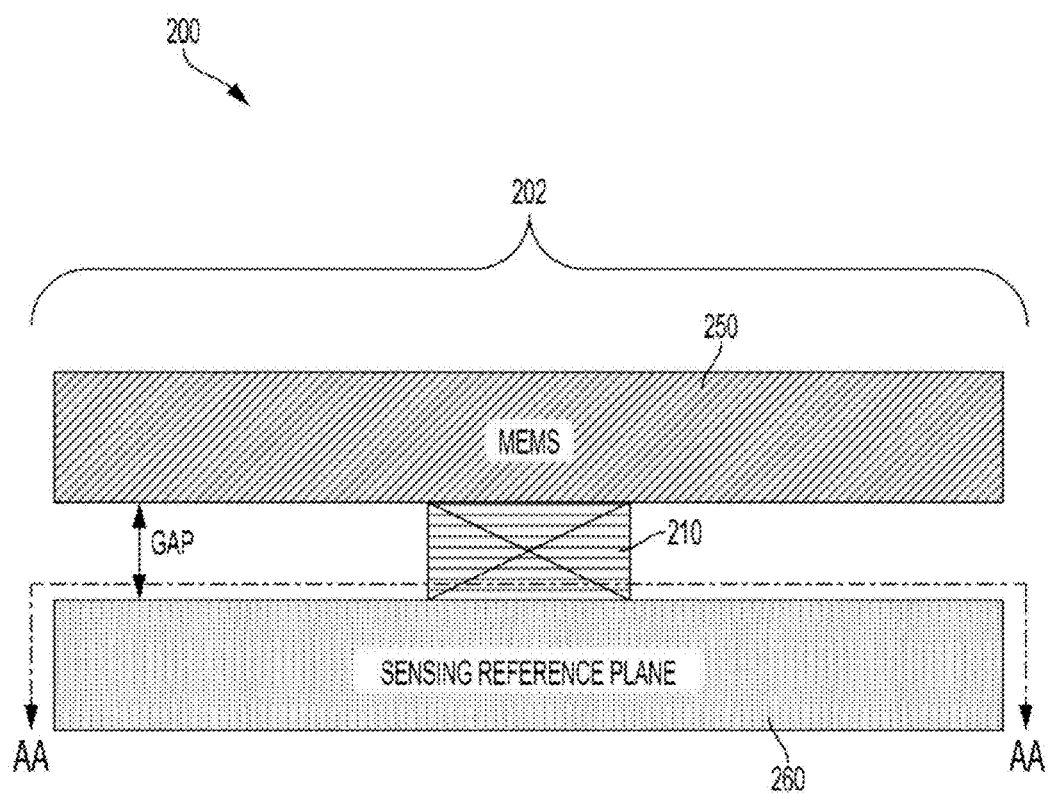
FIG. 2A illustrates a diagram with a cross-sectional view of a substrate portion of a MEMS sensor with a pattern of sensing elements in accordance with an embodiment.

FIG. 2A illustrates a diagram 200 with a cross-sectional view 202 of a substrate portion of a MEMS sensor with a pattern of sensing elements in accordance with an embodiment. The cross-sectional view 202 shows a MEMS sensor that comprises a MEMS device 250 coupled to a sensing reference plane 260 via the anchor 210 thereby creating a gap between the MEMS device 250 and the sensing reference plane 260. In the cross-sectional view 202, AA depicts the height of the sensing reference plane 260. In one embodiment, the MEMS device 250 is any of a MEMS structure and a MEMS accelerometer.

Figure 2B:
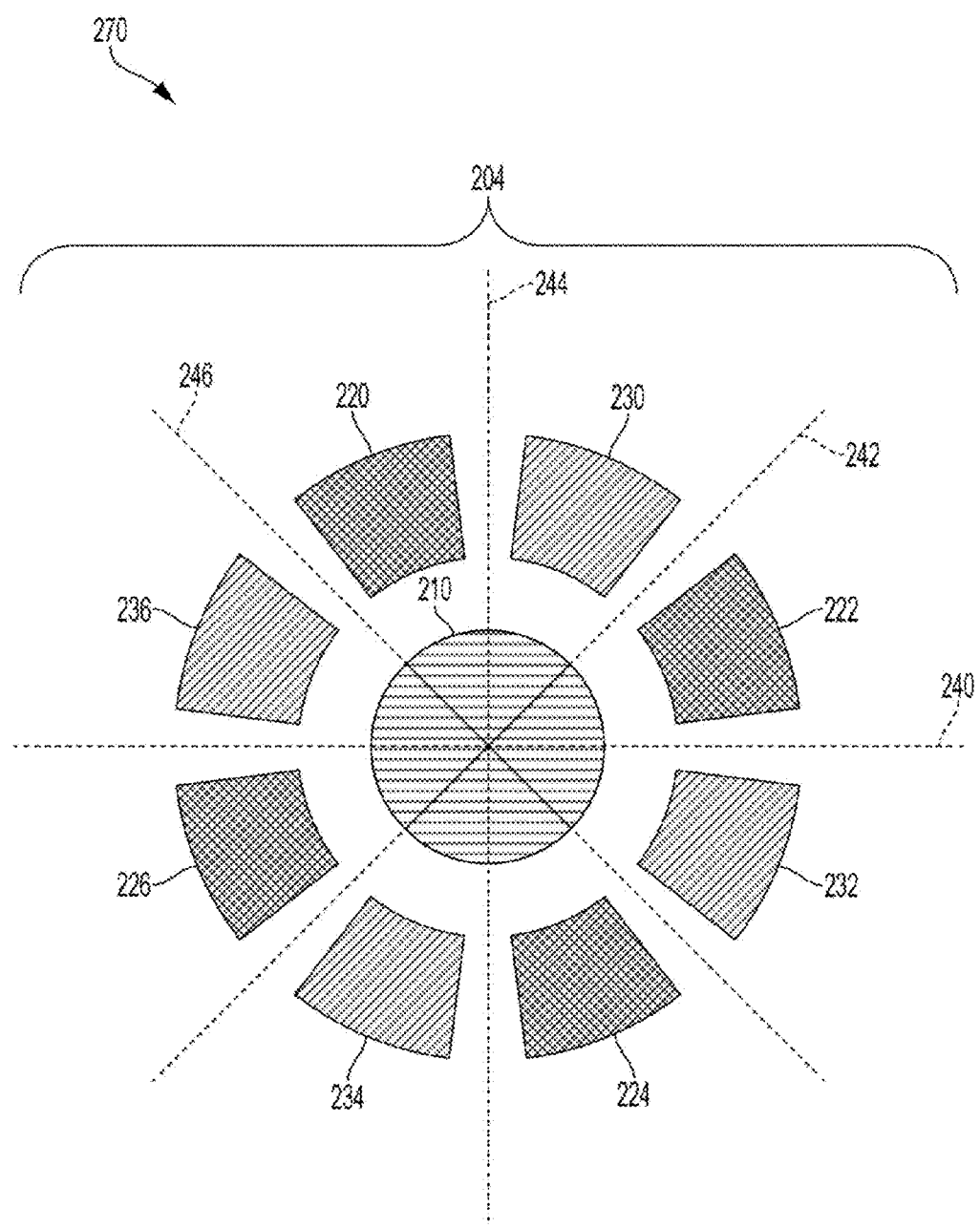
FIG. 2B illustrates a diagram with a top view of a substrate portion of a MEMS sensor with a pattern of sensing elements in accordance with an embodiment.

FIG. 2B illustrates a diagram 270 with a top view 204 of a substrate portion of a MEMS sensor with a pattern of sensing elements in accordance with an embodiment. The top view 204 shows a top view of AA which results in a top side of the pattern of sensing elements that comprise positive and negative electrodes. The top view 204 includes the anchor 210 of the MEMS sensor, positive electrodes 220, 222, 224, and 226, negative electrodes 230, 232, 234, and 236, and four axes of polarity anti-symmetry 240, 242, 244, and 246 denoted by the dashed lines. In FIG. 2A and FIG. 2B, the shape of the anchor 210 is circular to correspond to the shape of the pattern of sensing elements which is also circular.

In one embodiment, the MEMS device 250 comprises a spring connected between the anchor 210 and a proof mass. The proof mass moves in the z axis to an external force that includes but is not limited to acceleration, magnetic, Coriolis, pressure, and many others. The pattern of sensing elements comprise alternating positive and negative electrodes 220-226 and 230-236 and are connected between the MEMS device 250 and the sensing reference plane 260. The positive electrode sensing elements 220-226 detect positive movements and the negative electrode sensing elements 230-236 detect negative movements. In one embodiment, the shape of the electrode sensing elements 220-226 and 230-236 are annular sectors.

Figure 2C:
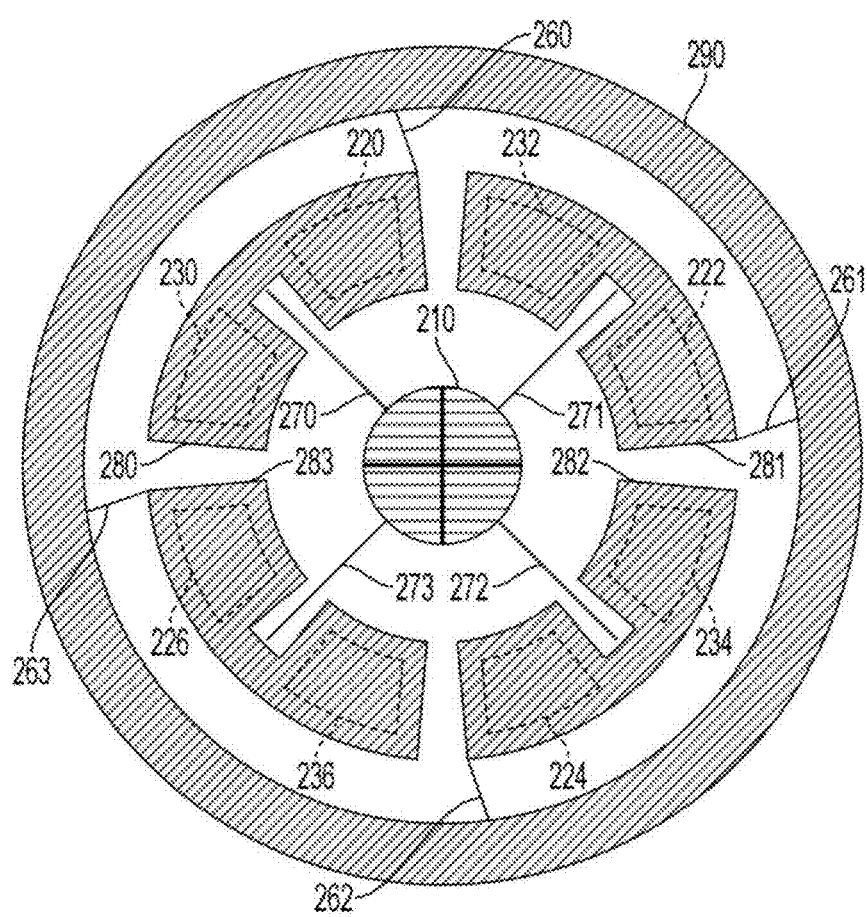
FIG. 2C illustrates a MEMS device of the MEMS sensor in accordance with an embodiment.

FIG. 2C illustrates a MEMS device of the MEMS sensor in accordance with an embodiment. In FIG. 2C, the MEMS device resembles the MEMS device 250 of FIG. 2A and is a MEMS Z axis accelerometer. In one embodiment, the MEMS device 250 further comprises, a first set of springs (260-263) and a second set of springs (270-273), sense masses 280-283, and a proof mass 290. The sense masses 280-283 are connected to the anchor 210 via the second set of springs 270-273 respectively. The sense masses 280-283 are connected to the proof mass 290 via the first set of springs 260-263 respectively. The sense masses 280-283 are detected by the positive electrodes 220, 222, 224, 226 respectively and by the negative electrodes 230, 232, 234, 236 respectively.

In one embodiment, the MEMS device 250 under positive (+) Z axis out-of-plane acceleration causes the proof mass 290 to move in a negative (−) z axis direction. The deflected proof mass 290 pushes on the first set of springs 260-263 thereby rotating the sense masses 280-283 about the second set of springs 270-273 respectively. This causes the gap between the positive electrodes 220, 222, 224 and 226 and each of the sense masses 280-283 to decrease and also causes the gap between the negative electrodes 230, 232, 234 and 236 and the sense masses 280-283 to increase.

In one embodiment, the MEMS device 250 under non-ideal conditions would behave like a flat plate like described by MEMS devices 104 and 106. The electrode pattern 204 has the properties of sensing the deflection of the MEMS device 250 under Z-axis acceleration but also rejecting non-ideal motion of MEMS device 250 described by MEMS device 104 and 106 in FIG. 1.

In this embodiment, the electrode sensing elements 220-226 and 230-236 form a differential sensing scheme. For example, the differential sensing scheme enables a gap to decrease above sensing elements 220, 222, 224, and 226 and to increase above sensing elements 230, 232, 234, and 236. Thus, motion is only detected if the gap between each pair of the positive electrode sensing elements 220-226 and the negative electrode sensing elements 230-236 and the MEMS device 250 changes due to movement by the proof mass. Therefore, the proof mass moves in a path that causes detectable motion using the differential scheme of the pattern of sensing elements (electrodes). The center of each of the sensing elements 220-226 and 230-236 has a common distance from the center of the anchor 210. As aforementioned, the sensing elements 220-226 and 230-236 have four axes of polarity anti-symmetry 240-246. In another embodiment, the pattern of sensing elements is designed with three or more axes of symmetry.

In the top view 204 of FIG. 2B, each of the positive sensing elements (electrodes) 220-226 has the same distance from anchor center to electrode center as the corresponding negative sensing elements (electrodes) 230-236. Thus, any movement that is the same on both sides of this axis would result in an equal gap shift of the positive and negative electrodes because when a positive and a negative electrode move together, no net output is generated.

Therefore, perpendicular to axis 240, the negative sensing element 236 has the same distance as the positive sensing element 222 (so electrode 236 corresponds with electrode 222 perpendicular to axis 240), the negative sensing element 230 has the same distance as the positive sensing element 220 (so electrode 230 corresponds with electrode 220 perpendicular to axis 240), the negative sensing element 232 has the same radius as the positive sensing element 226 (so electrode 232 corresponds with electrode 226 perpendicular to axis 240), and the negative sensing element 234 has the same distance as the positive sensing element 224 (so electrode 234 corresponds with electrode 224 perpendicular to axis 240). Any motion, rotation, curvature or any combination thereof, that is centered perpendicular to axis 240 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 242. In other words, each corresponding positive and negative electrode has the same distance from any point to the axis 242. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 242, the negative sensing element 230 has the same distance as the positive sensing element 226 (so electrode 230 corresponds with electrode 226 perpendicular to axis 242), the negative sensing element 236 has the same distance as the positive sensing element 220 (so electrode 236 corresponds with electrode 220 perpendicular to axis 242), the negative sensing element 232 has the same distance as the positive sensing element 224 (so electrode 232 corresponds with electrode 224 perpendicular to axis 242), and the negative sensing element 234 has the same distance as the positive sensing element 222 (so electrode 234 corresponds with electrode 222 perpendicular to axis 242). Any motion, rotation, curvature or any combination thereof, that is centered about axis 242 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 244. In other words, each corresponding positive and negative electrode has the same distance from any point to the axis 244. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 244, the negative sensing element 230 has the same distance as the positive sensing element 224 (so electrode 230 corresponds with electrode 224 perpendicular to axis 244), the negative sensing element 236 has the same distance as the positive sensing element 226 (so electrode 236 corresponds with electrode 226 perpendicular to axis 244), the negative sensing element 232 has the same distance as the positive sensing element 222 (so electrode 232 corresponds with electrode 222 perpendicular to axis 244), and the negative sensing element 234 has the same distance as the positive sensing element 220 (so electrode 234 corresponds with electrode 220 perpendicular to axis 244). Any motion, rotation, curvature or any combination thereof, that is centered about axis 244 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 246. In other words, each corresponding positive and negative electrode has the same distance from any point to the axis 246. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 246, the negative sensing element 230 has the same distance as the positive sensing element 222 (so electrode 230 corresponds with electrode 222 perpendicular to axis 246), the negative sensing element 236 has the same distance as the positive sensing element 224 (so electrode 236 corresponds with electrode 224 perpendicular to axis 246), the negative sensing element 232 has the same distance as the positive sensing element 220 (so electrode 232 corresponds with electrode 220 perpendicular to axis 246), and the negative sensing element 234 has the same distance as the positive sensing element 226 (so electrode 234 corresponds with electrode 226 perpendicular to axis 246). Any motion, rotation, curvature or any combination thereof, that is centered about axis 246 results in the positive sensing elements 220-226 moving in a similar fashion to the negative sensing element 230-236 thereby producing no net output and a zero offset with the differential sensing scheme.

Figure 3A:
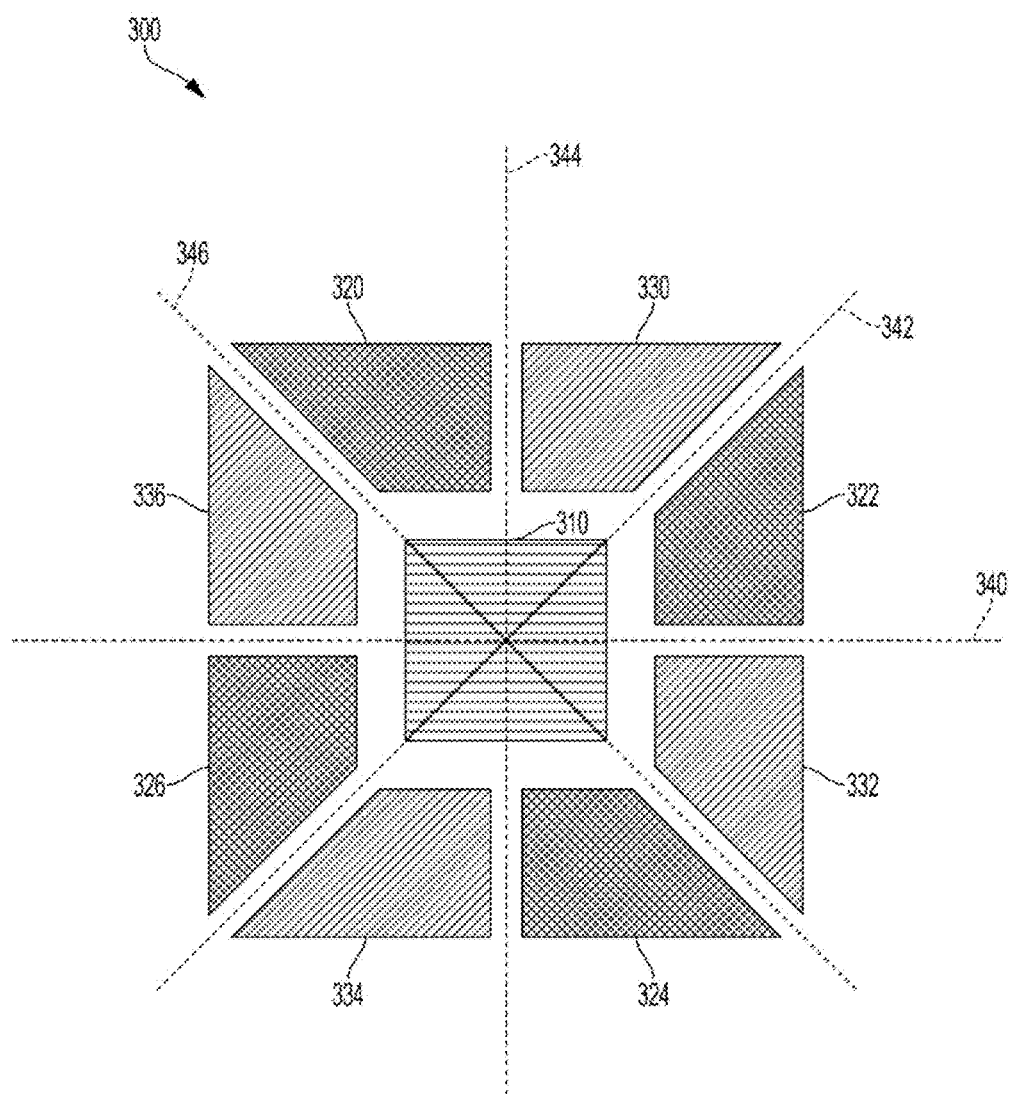
FIG. 3A illustrates a top view of a MEMS sensor with a pattern of sensing elements and the corresponding MEMS structure in accordance with another embodiment.

FIG. 3A illustrates a top view 300 of a MEMS sensor with a pattern of sensing elements and the corresponding MEMS structure in accordance with another embodiment. The top view 300 shows a top side of the pattern of sensing elements that comprise positive and negative electrodes. The top view 300 includes the anchor 310 of the MEMS sensor, positive electrodes 320, 322, 324, and 326, negative electrodes 330, 332, 334, and 336, and four axes of polarity anti-symmetry 340, 342, 344, and 346 denoted by the dashed lines. In FIG. 3A, the shape of the anchor 310 is square to correspond to the shape of the pattern of sensing elements which is also square.

In one embodiment, the MEMS sensor of FIG. 3A comprises a MEMS device coupled to a sensing reference plane via the anchor 310 thereby creating a gap between the MEMS device and the sensing reference plane. The MEMS device comprises a spring connected between the anchor 310 and a proof mass. The proof mass moves in the z axis in response to an external force that includes but is not limited to acceleration, magnetic field, Coriolis force, or pressure. The pattern of sensing elements comprises alternating positive and negative electrodes 320-326 and 330-336 on the sensing reference plane.

In this embodiment, the sensing elements 320-326 and 330-336 form a differential sensing scheme. Thus, motion is only detected if the gap between each pair of the positive electrode sensing elements 320-326 and the negative electrode sensing elements 330-336 and the MEMS device changes due to movement by the proof mass. When sensing acceleration, the proof mass moves in the same direction and in the same amount for each electrode pair (e.g., for positive sensing electrode 320 and negative sensing electrode 330). Therefore, the proof mass moves in a shape that causes detectable motion using the differential scheme of the pattern of sensing elements (electrodes). The center of each of the sensing elements 320-326 and 330-336 has a common distance from the center of the anchor 310. As aforementioned, the sensing elements 320-326 and 330-336 have four axes of anti-polarity symmetry 340-346. In another embodiment, the pattern of sensing elements is designed with three or less and five or more axes of symmetry.

In the top view 300 of FIG. 3A, each of the positive sensing elements (electrodes) 320-326 has the same distance as the corresponding negative sensing elements (electrodes) 330-336 perpendicular to axis 340. In other words, each corresponding positive and negative electrode has the same distance from any point to the axis 340. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 340, the negative sensing element 336 has the same distance as the positive sensing element 326 (so electrode 336 corresponds with electrode 326 perpendicular to axis 340), the negative sensing element 330 has the same distance as the positive sensing element 324 (so electrode 330 corresponds with electrode 324 perpendicular to axis 340), the negative sensing element 332 has the same distance as the positive sensing element 322 (so electrode 332 corresponds with electrode 322 perpendicular to axis 340), and the negative sensing element 334 has the same distance as the positive sensing element 320 (so electrode 334 corresponds with electrode 320 perpendicular to axis 3440). Any anchor rotation, curvature or any combination thereof, that is centered perpendicular to axis 340 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 342. In other words, each corresponding positive and negative electrode has the same distance from any point to the axis 342. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 342, the negative sensing element 330 has the same distance as the positive sensing element 326 (so electrode 330 corresponds with electrode 326 perpendicular to axis 342), the negative sensing element 336 has the same distance as the positive sensing element 320 (so electrode 336 corresponds with electrode 320 perpendicular to axis 342), the negative sensing element 332 has the same distance as the positive sensing element 324 (so electrode 332 corresponds with electrode 324 perpendicular to axis 342), and the negative sensing element 334 has the same distance as the positive sensing element 322 (so electrode 334 corresponds with electrode 322 perpendicular to axis 342). Any motion, rotation, curvature or any combination thereof, that is centered about axis 342 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 344. In other words, each corresponding positive and negative electrode has the same distance from any point to the axis 344. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 344, the negative sensing element 330 has the same distance as the positive sensing element 324 (so electrode 330 corresponds with electrode 320 perpendicular to axis 344), the negative sensing element 336 has the same distance as the positive sensing element 326 (so electrode 336 corresponds with electrode 326 perpendicular to axis 344), the negative sensing element 332 has the same distance as the positive sensing element 322 (so electrode 332 corresponds with electrode 322 perpendicular to axis 344), and the negative sensing element 334 has the same distance as the positive sensing element 320 (so electrode 334 corresponds with electrode 320 perpendicular to axis 344). Any motion, rotation, curvature or any combination thereof, that is centered about axis 344 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 346. In other words, each corresponding positive and negative electrode has the same distance from any point to the axis 346. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 346, the negative sensing element 330 has the same distance as the positive sensing element 322 (so electrode 330 corresponds with electrode 322 perpendicular to axis 346), the negative sensing element 336 has the same distance as the positive sensing element 324 (so electrode 336 corresponds with electrode 324 perpendicular to axis 346), the negative sensing element 332 has the same distance as the positive sensing element 320 (so electrode 332 corresponds with electrode 320 perpendicular to axis 346), and the negative sensing element 334 has the same distance as the positive sensing element 326 (so electrode 334 corresponds with electrode 326 perpendicular to axis 346). Any motion, rotation, curvature or any combination thereof, that is centered about axis 346 results in the positive sensing elements 320-326 moving in a similar fashion to the negative sensing element 330-336 thereby producing no net output and a zero offset with the differential sensing scheme.

Figure 3B:
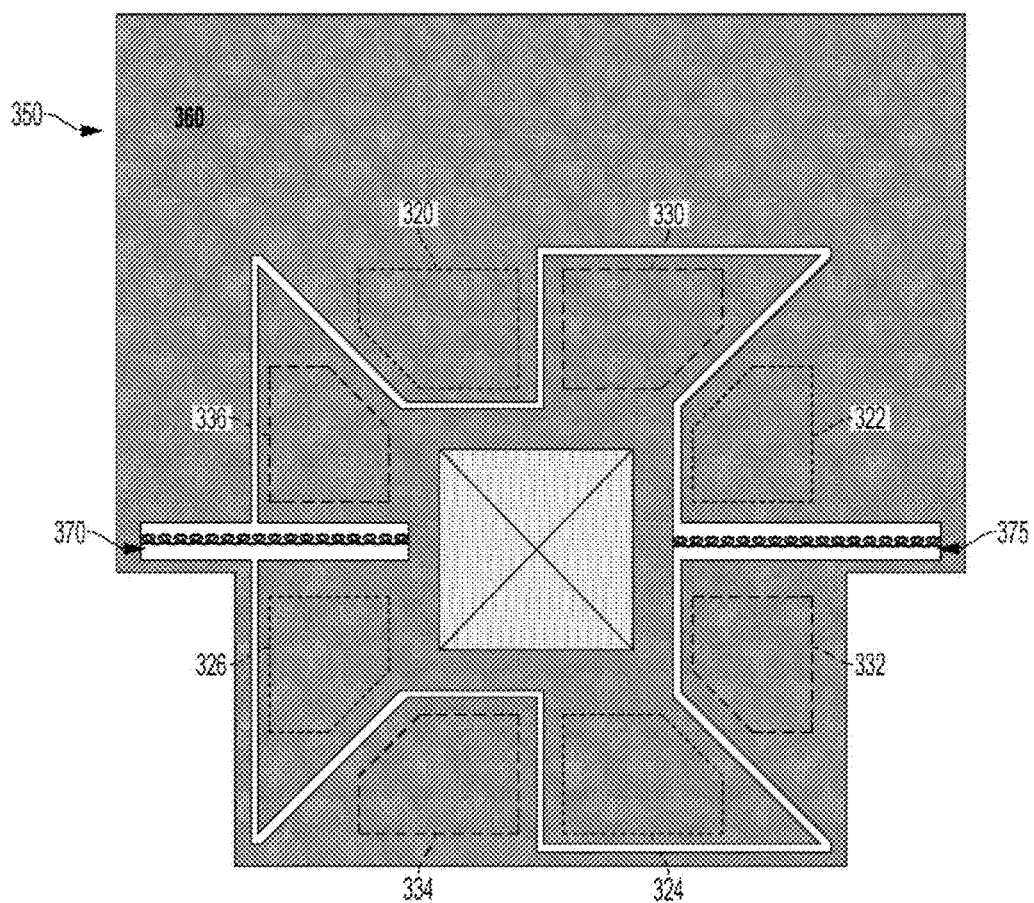
FIG. 3B illustrates a MEMS accelerometer structure of a MEMS sensor that uses an electrode pattern in accordance with an embodiment.

FIG. 3B illustrates a MEMS accelerometer structure 350 of a MEMS sensor that uses an electrode pattern in accordance with an embodiment. The MEMS accelerometer structure 350 resembles the MEMS device 250 in FIG. 2A. Under positive out-of-plane acceleration of the MEMS sensor, a proof mass 360 rotates about torsional springs 370 and 375 in a negative RX direction. This causes a decrease in a gap between positive sensing electrodes 320 and 322 and an increase in a gap between negative sensing electrodes 334 and 332, in reference to a sensing plane. In one embodiment, electrodes 324, 326, 330 and 336 are rigidly connected to an anchor and do not incur a gap change in response to an acceleration of the MEMS sensor. A signal processor combines electrodes 320-326 and 330-336 to output a signal proportional to the acceleration of the sensor.

In FIG. 3B, under anchor rotation of the MEMS sensor, as seen in the first non-ideal condition 104 of FIG. 1, all the electrodes 320-326 and 330-336 are connected to the anchor and move as a group similar to a flat plate as described in FIG. 3A about axes 340, 344, and 346. A signal processor combines electrodes 320-326 and 330-336 and no net output is generated if the anchor rotation or sensing reference plane curvature is centered about the axes 340-346. In this embodiment, the electrodes 320, 322, 332 and 334 are used to detect acceleration of the MEMS sensor and electrodes 320-326, 330-336 are used to reject offset caused from anchor rotation or sensing reference plane curvature.

Figure 4:
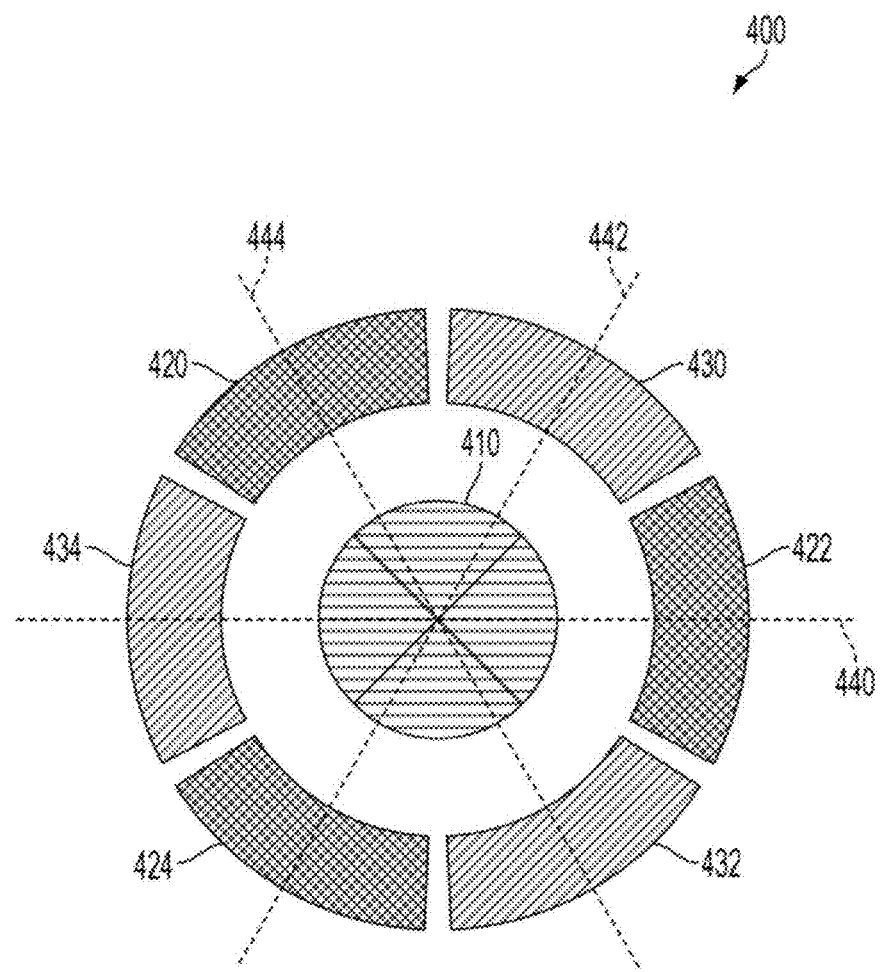
FIG. 4 illustrates a top view of a MEMS sensor with a pattern of sensing elements in accordance with another embodiment.

FIG. 4 illustrates a top view 400 of a MEMS sensor with a pattern of sensing elements in accordance with another embodiment. The top view 400 shows a top side of the pattern of sensing elements that comprise positive and negative electrodes. The top view 400 includes the anchor 410 of the MEMS sensor, positive electrodes 420, 422, and 424, negative electrodes 430, 432, and 434, and three axes of anti-polarity symmetry 440, 442, and 444 denoted by the dashed lines. In FIG. 4, the shape of the anchor 410 is circular to correspond to the shape of the pattern of sensing elements which is also circular.

In one embodiment, the MEMS sensor of FIG. 4 comprises a MEMS device coupled to a sensing reference plane via the anchor 410 thereby creating a gap between the MEMS device and the sensing reference plane. The MEMS device comprises a spring connected between the anchor 410 and a proof mass. The proof mass moves in the z axis to an external force that includes but is not limited to acceleration, magnetic field, Coriolis force, pressure, and many others. The pattern of sensing elements comprise alternating positive and negative electrodes 420-424 and 430-434 and are connected between the MEMS device and the sensing reference plane. The positive electrode sensing elements 420-424 detect positive movements and the negative electrode sensing elements 430-434 detect negative movements.

In this embodiment, the sensing elements 420-424 and 430-434 form a differential sensing scheme. Thus, motion is only detected if the positive electrode sensing elements 420-424 move relative to the negative electrode sensing elements 430-434. The proof mass moves in a shape that causes detectable motion using the differential scheme of the pattern of sensing elements (electrodes). The center of each of the sensing elements 420-424 and 430-434 has a common radius from the center of the anchor 410. As aforementioned, the sensing elements 420-424 and 430-434 have three axes of anti-polarity symmetry 440-444.

In the top view 400 of FIG. 4, each of the positive sensing elements (electrodes) 420-424 has the same distance as the corresponding negative sensing elements (electrodes) 430-434 perpendicular to axis 440. In other words, each corresponding positive and negative electrode has the same distance from any point to the axis 440. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 440, the negative sensing element 430 has the same distance as the positive sensing element 420 (so electrode 430 corresponds with electrode 420 perpendicular to axis 440), the negative sensing element 432 has the same distance as the positive sensing element 424 (so electrode 432 corresponds with electrode 424 perpendicular to axis 440) and the negative sensing element 434 has the same distance as the positive sensing element 422 (so electrode 434 corresponds with electrode 422 perpendicular to axis 440). Any motion, rotation, curvature or any combination thereof, that is centered about axis 440 results in the positive sensing elements 420-424 moving in a similar fashion to the negative sensing element 430-434 thereby producing no net output and a zero offset with the differential sensing scheme.

In the top view 400 of FIG. 4, each of the positive sensing elements (electrodes) 420-424 has the same distance as the corresponding negative sensing elements (electrodes) 430-434 perpendicular to axis 442. In other words, each corresponding positive and negative electrode has the same distance from any point to the axis 442. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 442, the negative sensing element 434 has the same distance as the positive sensing element 420 (so electrode 434 corresponds with electrode 420 perpendicular to axis 442), the negative sensing element 432 has the same distance as the positive sensing element 422 (so electrode 432 corresponds with electrode 422 perpendicular to axis 442) and the negative sensing element 430 has the same distance as the positive sensing element 424 (so electrode 430 corresponds with electrode 424 perpendicular to axis 442). Any motion, rotation, curvature or any combination thereof, that is centered about axis 442 results in the positive sensing elements 420-424 moving in a similar fashion to the negative sensing element 430-434 thereby producing no net output and a zero offset with the differential sensing scheme.

In the top view 400 of FIG. 4, each of the positive sensing elements (electrodes) 420-424 has the same distance as the corresponding negative sensing elements (electrodes) 430-434 perpendicular to axis 444. In other words, each corresponding positive and negative electrode has the same distance from any point to the axis 444. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 444, the negative sensing element 434 has the same distance as the positive sensing element 424 (so electrode 434 corresponds with electrode 424 perpendicular to axis 444), the negative sensing element 430 has the same distance as the positive sensing element 422 (so electrode 430 corresponds with electrode 422 perpendicular to axis 444) and the negative sensing element 432 has the same distance as the positive sensing element 420 (so electrode 432 corresponds with electrode 420 perpendicular to axis 444). Any motion, rotation, curvature or any combination thereof, that is centered about axis 444 results in the positive sensing elements 420-424 moving in a similar fashion to the negative sensing element 430-434 thereby producing no net output and a zero offset with the differential sensing scheme.

Figure 5:
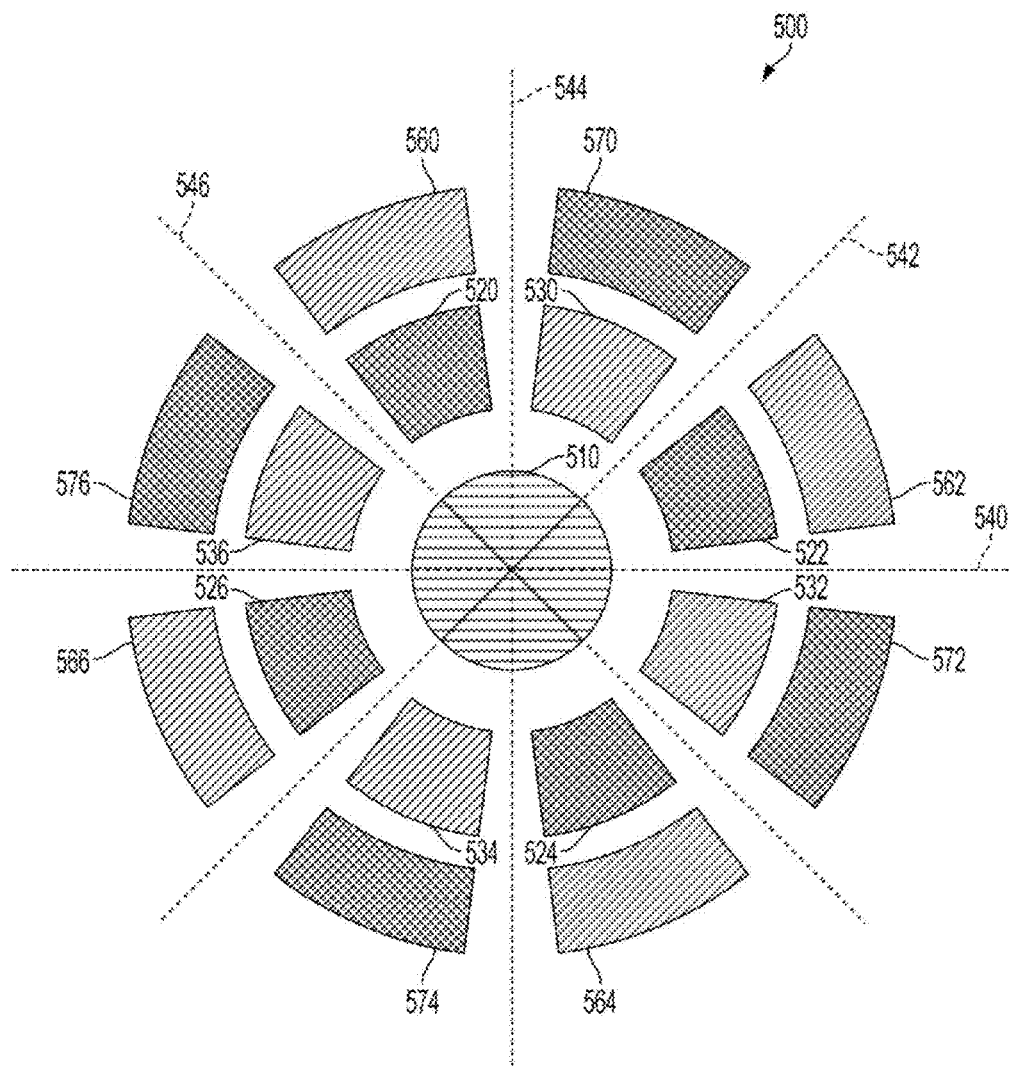
FIG. 5 illustrates a top view of a MEMS sensor with a pattern of sensing elements in accordance with another embodiment.

FIG. 5 illustrates a top view 500 of a MEMS sensor with a pattern of sensing elements in accordance with another embodiment. The top view 500 shows a top side of two independent patterns of sensing elements that comprise positive and negative electrodes. The top view 500 includes the anchor 510 of the MEMS sensor, positive electrodes 520, 522, 524, and 526 in the first pattern, negative electrodes 530, 532, 534, and 536 in the first pattern, positive electrodes 570, 572, 574, and 576 in the second pattern, negative electrodes 560, 562, 564, and 566 in the second pattern, and four axes of anti-polarity symmetry 540, 542, 544, and 546 denoted by the dashed lines. In FIG. 5, the shape of the anchor 510 is circular to correspond to the shape of the two independent patterns of sensing elements which are also circular. In another embodiment, the two patterns of sensing elements work in conjunction with each other and thus are dependent on each other.

In FIG. 5, the first pattern of sensing elements that comprises alternating positive electrodes 520-526 and negative electrodes 530-536 work in similar fashion as the pattern of sensing elements (220-226 and 230-236) in the top view 204 of FIG. 2. Additionally, the second pattern of sensing elements that comprises alternating positive electrodes 570-576 and negative electrodes 560-566 work in similar fashion as the pattern of sensing elements (220-226 and 230-236) in the top view 204 of FIG. 2 but add an additional level of sensitivity to further reduce the offset utilizing a dual differential sensing scheme. One of ordinary skill in the art readily recognizes that the electrodes of the first and/or the second patterns of sensing elements could be reorganized and that would be within the scope of the present invention.

Figure 6:
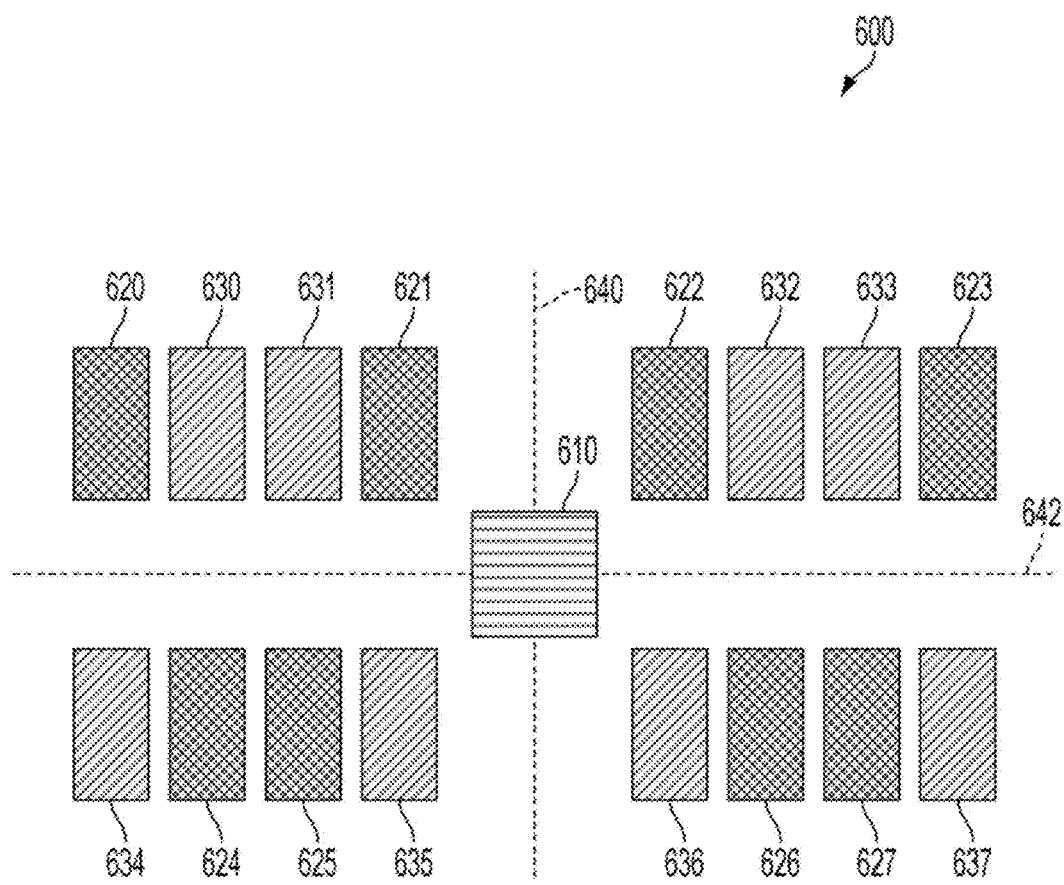
FIG. 6 illustrates a top view of a MEMS sensor with a pattern of sensing elements in accordance with another embodiment.

FIG. 6 illustrates a top view 600 of a MEMS sensor with a pattern of sensing elements in accordance with another embodiment. The top view 600 shows a top side of a pattern of sensing elements that comprise positive and negative electrodes in four quadrants that are divided by two axes 640 (y-axis) and 642 (x-axis) denoted by the dashed lines. The top view 600 includes the anchor 610 of the MEMS sensor, positive electrodes 620-621 and negative electrodes 630-631 in the first quadrant (upper left), positive electrodes 622-623 and negative electrodes 632-633 in the second quadrant (upper right), positive electrodes 624-625 and negative electrodes 634-635 in the third quadrant (lower left), and positive electrodes 626-627 and negative electrodes 636-637 in the fourth quadrant (lower right).

In FIG. 6, the positive electrodes 620-627 have a 'W' shape centered about the center of the anchor 610 and the negative electrodes 630-637 have an 'M' shape centered about the center of the anchor 610. The negative electrodes 630-637 are interwoven with the positive electrodes 620-627 to create the pattern of sensing elements that reduces the offset cause by undesirable conditions.

Due to the pattern of sensing elements of FIG. 6, any rotation that is centered about axis 642 produces no net output and a zero offset because positive electrodes 620-623 share the same distance (distance defined as the perpendicular distance between the electrode center and the axis) as negative electrodes 630-633 and positive electrodes 624-627 share the same distance as negative electrodes 634-637. Any curvature along axis 642 produces no net output and a zero offset because distance positive electrodes 620-623 share the same distance as negative electrodes 630-633 and positive electrodes 624-627 share the same distance as negative electrodes 634-637. Likewise, any curvature along axis 640 produces no net output and a zero offset because positive electrodes 620-621 and 624-625 share the same distance as negative electrodes 630-631 and 634-635, and positive electrodes 622-623 and 626-627 share the same distance as negative electrodes 632-633 and 636-637; and any rotation that is centered perpendicular to axis 640 produces no net output and a zero offset because positive electrodes 620-621 and 624-625 share the same distance as negative electrodes 630-631 and 634-635, and positive electrodes 622-623 and 626-627 share the same distance as negative electrodes 632-633 and 636-637 distance.

In one embodiment, electrodes 630 and 631 are joined into one electrode, electrodes 624 and 625 are joined into one electrode, electrodes 632 and 633 are joined into one electrode and electrodes 626 and 627 are joined into one electrode.

In a first embodiment, a MEMS sensor comprises a sensing reference plane, at least one anchor coupled to the sensing reference plane, and at least one proof mass coupled to the at least one anchor, wherein one of the at least one proof mass moves under an external excitation. The MEMS sensor further comprises a pattern of sensing elements (or sensing electrodes) that lies on the sensing reference plane or is coupled between the sensing reference plane and the at least one proof mass to detect motion of the at least one proof mass normal to the sensing reference plane, wherein the pattern of sensing elements shares at least three axes of polarity anti-symmetry. The MEMS sensor further comprises a signal processing circuit to combine the pattern of sensing elements thereby providing an output proportional to the external excitation. In one embodiment, the output is a difference between positive and negative sensing elements of the pattern of sensing elements.

In one embodiment, the at least one proof mass is coupled to the at least one anchor by at least one spring. In one embodiment, the pattern of sensing elements share any of one, two, three, four, and five or greater axes of polarity anti-symmetry. In one embodiment, a centroid of each sensing element shares a common distance to a center of the at least one anchor. In one embodiment, the pattern of sensing elements comprising sensing electrodes forming a variable capacitor between each electrode and the at least one proof mass.

In one embodiment, the pattern of sensing electrodes comprise alternating positive and negative electrodes and in another embodiment, the positive and negative electrodes are not alternating and instead can include two or more positive and/or two or more negative electrodes next to each other. In one embodiment, the pattern of sensing electrodes comprises at least three positive sensing electrodes and at least three negative sensing electrodes that are alternating.

In one embodiment, each negative sensing element/electrode has the same area as each positive sensing element/electrode and in another embodiment, each negative sensing element/electrode has substantially the same electrode area as each positive sensing element/electrode. In one embodiment, the sensing electrodes are any of capacitive sensing, piezoresistive sensing, and magnetic sensing electrodes. In one embodiment, a center of each of the sensing electrodes is on a perimeter of any of a circle, rectangle, square, hexagon, octagon, and other polygon and the sensing electrodes themselves are any of circular, rectangular, square, hexagonal, octagonal, annular sector, and polygonal in shape.

In one embodiment, the MEMS sensor further comprises a second pattern of sensing elements on the sensing reference plane to detect the motion of the at least one proof mass relative to the sensing reference plane, wherein each sensing element of the second pattern of sensing elements shares at least three axes of polarity anti-symmetry and further wherein a centroid of each sensing element of the second pattern of sensing elements shares a second common distance to the center of the at least one anchor. In another embodiment, the MEMS sensor comprises a plurality of patterns of sensing elements that are coupled either on top of each other or next to each other to further reduce the offset.

In a second embodiment, the sensing reference plane of the MEMS sensor is divided by two axes (a first and a second axis) forming four quadrants on the sensing reference plane and the pattern of sensing elements comprises at least three sensing elements in each of the four quadrants to detect motion of the at least one proof mass relative to the sensing reference plane. In this embodiment, the MEMS sensor includes at least one anchor coupled to the sensing reference plane and at least one proof mass coupled to the at least one anchor, wherein one of the at least one proof mass moves under an external excitation. Each of the four quadrants includes two outside sensing electrodes of a first polarity and two inside sensing electrodes of a second polarity. The first polarity is opposite of the second polarity and there is polarity anti-symmetry of the at least three sensing elements in each of the four quadrants.

In one embodiment, in each of the four quadrants the closest sensing element and the furthest sensing element, relative to one of the first or second axes, is of a first polarity and in between the first polarity there is at least one sensing element of a second polarity. In one embodiment, the first polarity is opposite of the second polarity and there is polarity anti-symmetry of the four quadrants about at least one of the first or the second axis. In one embodiment, a center of the at least one anchor coincides with an intersection of the first and the second axis. In one embodiment, a centroid of the at least three sensing elements in each of the four quadrants shares a common distance from at least one of the first or the second axis. In one embodiment, a sensing element area is substantially the same between the first and the second polarity.

In one embodiment, the pattern of sensing elements comprises a first and a second pattern, wherein the first pattern is a M-shaped polarity pattern centered about the at least one anchor and the second pattern is a W-shaped polarity pattern centered about the at least one anchor. In one embodiment, at least a portion of the at least four sensing elements in each of the four quadrants is in a straight line and in another embodiment, at least a portion of the at least four sensing elements in each of the four quadrants is in a non-straight line and/or orientation.

The sensing elements of the at least four sensing elements that have opposite polarities share a common distance from one of the lines of symmetry. In one embodiment, the at least four sensing elements are any of circular, rectangular, square, hexagonal, octagonal, and polygonal in shape. In another embodiment, the sensing reference plane is not divided into any quadrants and the pattern of sensing elements instead comprises two sets of at least four sensing elements that are on the same axis and on opposite sides of the at least one anchor.

As above described, a system (MEMS sensor) and a method in accordance with the present invention utilizes a plurality of patterns of sensing elements (electrodes) on a sensing reference plane to reduce the adverse effects of deviations in parallel alignment between the MEMS device of the MEMS sensor and the sensing reference plane that occur due to various undesirable forces. The deviations in parallel alignment cause offsets and each of the plurality of patterns produces no net output and improves offset rejection (provides a zero or reduced offset) by utilizing a plurality of sensing schemes that counteract the detected rotational and/or curvature type forces.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS sensor, comprising:
    a substrate;
    at least one anchor coupled to the substrate;
    at least one proof mass coupled to the at least one anchor, wherein one of the at least one proof mass moves under an external excitation;
    a pattern of sensing elements coupled between the substrate and the at least one proof mass to detect motion normal to the substrate wherein the pattern of sensing elements shares at least three axes of polarity anti-symmetry; and
    a signal processing circuit to combine output signals of the pattern of sensing elements thereby providing an output proportional to the external excitation.

2. The MEMS sensor of claim 1, wherein the centroid of each sensing element shares a common distance to a center of the at least one anchor.

3. The MEMS sensor of claim 1, wherein the pattern of sensing elements comprises sensing electrodes forming a variable capacitor between each electrode and the at least one proof mass.

4. The MEMS sensor of claim 1, wherein the pattern of sensing elements comprises at least three positive sensing elements and at least three negative sensing elements that are alternating.

5. The MEMS sensor of claim 1, wherein each sensing element is a magnetic sensing element.

6. The MEMS sensor of claim 1, wherein the center of each sensing element is on a perimeter of any of a circle, rectangle, square, hexagon, octagon, and other polygon.

7. The MEMS sensor of claim 1, wherein each sensing element is any of circular, rectangular, square, hexagonal, octagonal, annular sector, and polygonal in shape.

8. The MEMS sensor of claim 4, wherein each negative sensing element has the same area as each positive sensing element.

9. The MEMS sensor of claim 2, further comprising:
    a second pattern of sensing elements on the substrate to detect the motion of the at least one proof mass relative to the substrate, wherein the second pattern of sensing elements shares at least three axes of polarity anti-symmetry.

10. The MEMS sensor of claim 9, wherein the centroid of each sensing element of the second pattern of sensing elements shares a second common distance to the center of the at least one anchor.

* * * * *